United States Patent
Kang et al.

(10) Patent No.: US 11,092,894 B2
(45) Date of Patent: Aug. 17, 2021

(54) METHOD FOR FORMING PATTERN USING ANTI-REFLECTIVE COATING COMPOSITION COMPRISING PHOTOACID GENERATOR

(71) Applicant: Rohm and Haas Electronic Materials Korea Ltd., Chungcheongnam-Do (KR)

(72) Inventors: Jihoon Kang, Gyeonggi-do (KR); Hye-Won Lee, Gyeonggi-do (KR); Seung Uk Lee, Seoul (KR); Sook Lee, Seoul (KR); Jae-Bong Lim, Chungcheongnam-do (KR)

(73) Assignee: Rohm and Haas Electronic Materials Korea Ltd., Chungcheongnam-do (KR)

( * ) Notice: Subject to any disclaimer, the term of this patent is extended or adjusted under 35 U.S.C. 154(b) by 0 days.

(21) Appl. No.: 14/586,956

(22) Filed: Dec. 31, 2014

(65) Prior Publication Data

US 2016/0187781 A1    Jun. 30, 2016

(51) Int. Cl.
| | |
|---|---|
| *G03F 7/32* | (2006.01) |
| *G03F 7/20* | (2006.01) |
| *G03F 7/38* | (2006.01) |
| *G03F 7/09* | (2006.01) |
| *G03F 7/038* | (2006.01) |
| *G03F 7/039* | (2006.01) |
| *G03F 7/004* | (2006.01) |

(52) U.S. Cl.
CPC ............ *G03F 7/325* (2013.01); *G03F 7/0045* (2013.01); *G03F 7/0382* (2013.01); *G03F 7/0392* (2013.01); *G03F 7/091* (2013.01); *G03F 7/2041* (2013.01); *G03F 7/38* (2013.01)

(58) Field of Classification Search
None
See application file for complete search history.

(56) References Cited

U.S. PATENT DOCUMENTS

| 5,851,730 | A | 12/1998 | Thackeray et al. |
|---|---|---|---|
| 5,886,102 | A | 3/1999 | Sinta et al. |
| 6,261,743 | B1 * | 7/2001 | Pavelchek ............ C08J 9/26 430/156 |
| 6,348,404 | B1 | 2/2002 | Tabara et al. |
| 6,849,373 | B2 | 2/2005 | Pavelchek et al. |
| 8,790,867 | B2 | 7/2014 | Bae et al. |
| 9,458,348 | B2 | 10/2016 | Bae et al. |
| 2004/0224254 | A1 | 11/2004 | Carey et al. |
| 2005/0214674 | A1 * | 9/2005 | Sui ................ G03F 7/0392 430/270.1 |
| 2006/0057491 | A1 | 3/2006 | Wayton et al. |
| 2010/0092894 | A1 * | 4/2010 | Liu ................. G03F 7/091 430/325 |
| 2011/0033800 | A1 | 2/2011 | Zampini et al. |
| 2011/0033801 | A1 * | 2/2011 | Zampini ........... C09D 167/02 430/271.1 |
| 2012/0282548 | A1 * | 11/2012 | Enomoto ........... G03F 7/0045 430/284.1 |
| 2013/0004893 | A1 | 1/2013 | Jain et al. |
| 2013/0004901 | A1 | 1/2013 | Ongayi et al. |
| 2013/0040238 | A1 * | 2/2013 | Chen ................ G03F 7/091 430/271.1 |
| 2013/0244438 | A1 | 9/2013 | Bae et al. |

FOREIGN PATENT DOCUMENTS

| JP | S6379322 A | 4/1988 |
|---|---|---|
| JP | H1174274 A | 3/1999 |
| JP | 2005346051 A | 12/2005 |
| TW | 201317715 A | 5/2013 |
| TW | 201327046 A | 7/2013 |
| WO | 2013089277 A1 | 6/2013 |

OTHER PUBLICATIONS

Guerrero, et al, "BARC surface property matching for negative-tone development of a conventional positive-tone photoresist," Proc. of SPIE, 2011, pp. 79720Q-1 thru 79720Q-7, vol. 7972.
English language summary of Office Action issued in related Japanese Application 2015-000579 (4 pages), (dated 2018).
English language summary of Office Action issued in related Taiwan Application 107-2(7)01201-10720677720 (4 pages), (dated 2018).
English language summary of Office Action issued in related Chinese Application 201410858451.9 (3 pages), (dated 2019).

* cited by examiner

*Primary Examiner* — Sin J Lee
(74) *Attorney, Agent, or Firm* — Mintz Levin Cohn Ferris Glovsky and Popeo, P.C.; Peter F. Corless

(57) ABSTRACT

The present invention relates to a method for forming a pattern by negative tone development (NTD) which is prepared by forming an anti-reflective coating composition layer comprising a photoacid generator between the substrate and the photoresist composition layer, and thus exhibits improved line width (CD) in the pattern and prevents pattern collapse owing to thorough activation of de-blocking of the photoresist composition layer during the exposure process.

11 Claims, 1 Drawing Sheet

METHOD FOR FORMING PATTERN USING ANTI-REFLECTIVE COATING COMPOSITION COMPRISING PHOTOACID GENERATOR

FIELD OF THE INVENTION

The present invention relates to a method for forming a pattern by negative tone development (NTD) in a photolithographic process.

BACKGROUND OF THE INVENTION

A photoresist is a photosensitive composition which is used to transfer an image to a substrate. A coating layer of the photoresist is formed on the substrate, and then exposed to actinic radiation through a photomask. The photomask has regions which are opaque and transparent to actinic radiation. When the photoresist coating layer is exposed to the actinic radiation, light-inducible chemical modification occurs on the photoresist coating layer. As a result, a pattern of the photomask is transferred to the photoresist coating layer. Thereafter, the photoresist coating layer is developed to form a patterned image to be capable of being selectively treated on a substrate.

Typically, a chemically amplified negative-tone photoresist comprises an acid-labile leaving group and a resin having a photoacid generator. When such photoresist is exposed to chemical radiation rays, the photoacid generator forms an acid, and the acid thus formed causes the acid-labile group to detach in the resin during the post-exposure bake process. The removal of the acid-labile group creates differences in solubility characteristics towards an aqueous alkaline developer or a hydrophobic organic solvent-based developer between light exposure area and non-exposure area. Exposure area of a resist is soluble in aqueous alkaline developers, and is insoluble in hydrophobic organic solvent-based developers. In the manufacturing process of a semiconductor device, a positive tone process employs an aqueous alkaline developer and leaves only non-exposed area of the photoresist on the substrate; whereas a negative tone process employs a hydrophobic organic solvent-based developer and leaves only exposed area of the photoresist on the substrate.

Generally, photoresists are used to manufacture semiconductors in which semiconductor wafers such as Si or GaAs are converted into a composite matrix of an electronic conduction path (preferably micron or submicron geometry) for performing circuit functions. To achieve such objects, it is important to properly treat the photoresist. Several operations used to treat the photoresist act interdependently, but one of the most important operations to obtain a high-resolution photoresist image is a light exposure operation.

In such a light exposure operation, when the actinic radiation radiated to the photoresist coating layer is reflected, resolution of the image patterned on the photoresist coating layer may be degraded. For example, when the actinic radiation is reflected on an interface between the substrate and the photoresist, a spatial variation in intensity of the actinic radiation radiated to the photoresist coating layer is caused, and the actinic radiation is scattered toward an unintended photoresist region, resulting in a change or a lack of uniformity in line width of the pattern upon development. Also, since there are differences in quantities of scattered or reflected actinic radiation between the regions, the line width may become less uniform, for example, the resolution may be restricted according to topography of the substrate.

To solve the reflection-related problems as described above, a light absorption layer, that is, an anti-reflective coating layer, is used between a surface of the substrate and the photoresist coating layer (see U.S. Pat. Nos. 5,939,236, 5,886,102, 5,851,738, 5,851,730, etc.).

In the case of such conventional anti-reflective coating layers, however, negative tone development (NTD) in a photolithographic process frequently suffers from pattern collapse when the pattern has a small critical dimension (40 nm or less). This phenomenon has caused deterioration in product quality, as well as low yields due to considerable difficulty in securing a process margin.

SUMMARY OF THE INVENTION

Accordingly, it is an object of the present invention to provide a method for forming a pattern by negative tone development (NTD) using an anti-reflective coating layer to address the above-mentioned problems.

In order to achieve this object, the present invention provides a method for forming a pattern by negative tone development, which comprises the steps of: (1) forming on a substrate a layer of an anti-reflective coating composition comprising (a) an organic polymer, (b) a photoacid generator, and (c) a crosslinker; (2) forming a layer of a photoresist composition on the anti-reflective coating composition layer; (3) exposing the photoresist composition layer and the anti-reflective coating composition layer to activating radiation at the same time, followed by baking; and (4) developing the exposed photoresist composition layer with an organic solvent developer.

The method for forming a pattern by negative tone development of the present invention is prepared by forming an anti-reflective coating composition layer comprising a photoacid generator between the substrate and the photoresist composition layer, and thus exhibits improved line width (CD) in the pattern and prevents pattern collapse owing to thorough activation of de-blocking of the photoresist composition layer during the exposure process.

BRIEF DESCRIPTION OF THE DRAWINGS

The above and other objects and features of the present invention will become apparent from the following description of the invention, when taken in conjunction with the accompanying drawing, which shows:

FIG. 1: SEM images of line/space patterns of the photoresist composition layers which were formed by subjecting anti-reflective coating compositions obtained in Example 1 and Comparative Examples 1 and 2 to a photolithographic process by negative tone development (NTD), followed by exposing the resulting layer to various amounts of light.

DETAILED DESCRIPTION OF THE INVENTION

Exemplary embodiments of the present invention will be described in detail below.

Anti-Reflective Coating Composition for Negative Tone Development (NTD)

An anti-reflective coating composition which is used in a method for forming a pattern by negative tone development of the present invention comprises: (a) an organic polymer, (b) a photoacid generator, and (c) a crosslinker.

(a) Organic Polymer

The organic polymer comprises: (a-1) at least one unit derived from a cyanurate-based compound having two or more groups selected from carboxy and carboxyester; and (a-2) at least one unit derived from a diol or a polyol.

For example, the structural unit (a-1) may be at least one compound derived from a compound represented by the following Formula 1:

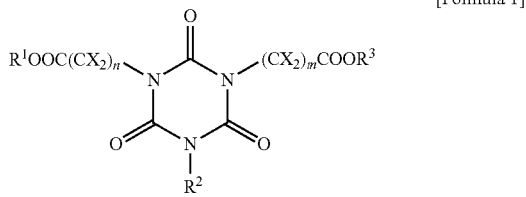

[Formula 1]

In Formula 1, at least two of $R^1OOC(CX_2)_n$—, $R^2$—, and $R^3OOC(CX_2)_m$— represent different acids, or ester groups;

$R^1$, $R^2$, $R^3$ and X each independently represent hydrogen, or a non-hydrogen substituent, where the non-hydrogen substituent represents a substituted or unsubstituted $C_{1-10}$ alkyl group, a substituted or unsubstituted $C_{2-10}$ alkenyl or $C_{2-10}$ alkynyl group (for example, allyl, etc.), a substituted or unsubstituted $C_{1-10}$ alkanoyl group, a substituted or unsubstituted $C_{1-10}$ alkoxy group (for example, methoxy, propoxy, butoxy, etc.), an epoxy group, a substituted or unsubstituted $C_{1-10}$ alkylthio group, a substituted or unsubstituted $C_{1-10}$ alkylsulfinyl group, a substituted or unsubstituted $C_{1-10}$ alkylsulfonyl group, a substituted or unsubstituted carboxyl group, a substituted or unsubstituted —COO—$C_{1-8}$ alkyl group, a substituted or unsubstituted $C_{6-12}$ aryl group (for example, phenyl, naphthyl, etc.), or a substituted or unsubstituted 5- to 10-membered heteroalicyclic or heteroaryl group (for example, methylphthalimide, N-methyl-1,8-phthalimide, etc.); and n and m are the same as or different from each other, and each is an integer greater than 0.

For example, the structural unit (a-2) may be derived from a diol or a polyol.

Particular examples of a suitable diol may include ethylene glycol; 1,3-propanediol; 1,2-propanediol; 2,2-dimethyl-1,3-propanediol; 2,2-diethyl-1,3-propanediol; 2-ethyl-3-methyl-1,3-propanediol; 2-methyl-2-propyl-1,3-propanediol; 2-butyl-2-ethyl-1,3-propanediol; 1,4-butanediol; 2-methyl-1,4-butanediol; 1,2-butanediol; 1,3-butanediol; 2,3-butanediol; 2,3-dimethyl-2,3-butanediol; 1,5-pentanediol; 1,2-pentanediol; 2,4-pentanediol; 2-methyl-2,4-pentanediol; 1,6-hexanediol; 2,5-hexanediol; 1,2-hexanediol; 1,5-hexanediol; 2-ethyl-1,3-hexanediol; 2,5-dimethyl-2,5-hexanediol; 1,7-heptanediol; 1,8-octanediol; 1,2-octanediol; 1,9-nonanediol; 1,10-decanediol; 1,2-decanediol; 1,12-dodecanediol; 1,2-dodecanediol; 1,2-tetradecanediol; 1,2-hexadecanediol; 1,16-hexadecanediol; 1,2-cyclobutanedimethanol; 1,4-cyclohexanedimethanol; 1,2-cyclohexanedimethanol; 5-norbornene-2,2-dimethanol; 3-cyclohexene-1,1-dimethanol; dicyclohexyl-4,4'-diol; 1,2-cyclopentanediol; 1,3-cyclopentanediol; 1,2-cyclooctanediol; 1,4-cyclooctanediol; 1,5-cyclooctanediol; 1,2-cyclohexanediol; 1,3-cyclohexanediol; 1,4-cyclohexanediol; 1,2-cycloheptanediol; 2,2,4,4-tetramethyl-1,3-cyclobutanediol; 1,2-cyclododecanediol; decahydronaphthalene-1,4-diol; decahydronaphthalene-1,5-diol; 3-chloro-1,2-propanediol; 1,4-dibromobutane-2,3-diol; 2,2,3,3-tetrafluoro-1,4-butanediol; diethylene glycol; triethylene glycol; tetraethylene glycol; pentaethylene glycol; dipropylene glycol; isosorbide; isomannide; 1,3-dioxane-5,5-dimethanol; 1,4-dioxane-2,3-diol; 1,4-diethane-2,5-diol; 1,2-dithiane-4,5-diol; 2-hydroxyethyldisulfide; 3,6-dithia-1,8-octanediol; 3,3'-thiodipropanol; 2,2'-thiodiethanol; 1,3-hydroxyacetone; 1,5-dihydroxy-2,2,4,4-tetrachloro-3-pentanone; glyceraldehyde; benzopinacol; 1,1,4,4-tetraphenyl-1,4-butanediol; 3,4-bis(p-hydroxyphenol)-3,4-hexanediol; 1,2-benzenedimethanol; 1,4-benzenedimethanol; 2,3,5,6-tetramethyl-p-xylene-α,α'-diol; 2,4,5,6-tetrachlorobenzene-1,3-dimethanol; 2,3,5,6-tetrachlorobenzene-1,4-dimethanol; 2,2-diphenyl-1,3-propandiol; 3-(4-chlorophenoxy)-1,2-propandiol; 2,2'-(p-phenylenedioxy)-diethanol; 5-nitro-m-xylene-α,α'-diol; 1,8-bis(hydroxymethyl)naphthalene; 2,6-bis(hydroxymethyl)-p-cresol; O,O'-bis(2-hydroxyethyl)benzene; 1,2-O-isopropylidenexylofuranose; 5,6-isopropylidene ascorbic acid; 2,3-O-isopropylidenethreitol and the like.

Particular examples of a suitable triol may include glycerol; 1,1,1-tris(hydroxymethyl)ethane; 2-hydroxymethyl-1,3-propanediol; 2-ethyl-2-(hydroxymethyl)-1,3-propanediol; 2-hydroxymethyl-2-propyl-1,3-propanediol; 2-hydroxymethyl-1,4-butanediol; 2-hydroxyethyl-2-methyl-1,4-butanediol; 2-hydroxymethyl-2-propyl-1,4-butanediol; 2-ethyl-2-hydroxyethyl-1,4-butanediol; 1,2,3-butanetriol; 1,2,4-butanetriol; 3-(hydroxymethyl)-3-methyl-1,4-pentanediol; 1,2,5-pentanetriol; 1,3,5-pentanetriol; 1,2,3-trihydroxyhexane; 1,2,6-trihydroxyhexane; 2,5-dimethyl-1,2,6-hexanetriol; tris(hydroxymethyl)nitromethane; 2-methyl-2-nitro-1,3-propanediol; 2-bromo-2-nitro-1,3-propanediol; 1,2,4-cyclopentanetriol; 1,2,3-cyclopentanetriol; 1,3,5-cyclohexanetriol; 1,3,5-cyclohexanetrimethanol; 1,3,5-tris(2-hydroxyethyl)cyanuric acid; 1,2-O-isopropylideneidofuranose; 1,2-O-isopropylideneglucofuranose; methylxylopyranoside; croconic acid and the like.

Particular examples of a suitable tetraol may include 1,2,3,4-butanetetrol; 2,2-bis(hydroxymethyl)-1,3-propanediol; 1,2,4,5-pentanetetrol; tetrahydroxy-1,4-benzoquinone; a-methyl mannopyranoside; 2-deoxygalactose; 3-O-methyl-glucose; ribose; xylose and the like.

The amount of the organic polymer may be 70.0 to 95.0 wt %, based on the total weight of the anti-reflective coating composition. More specifically, the amount of the organic polymer may be 78 to 90 wt %.

(b) Photoacid Generator

The photoacid generator is not specifically limited and may be used alone or in combination of two or more.

For example, onium salt-based, nitrobenzyl-based, sulfonic acid ester-based, diazomethane-based, glyoxime-based, N-hydroxyimide sulfonic acid ester-based, and halotriazine-based photoacid generators may be used as the photoacid generator.

The onium salt-based photoacid generator may be a sulfonate, and a salt of sulfonium containing an aromatic group. Particular examples of the onium salt-based photoacid generator may include triphenylsulfonium trifluoromethanesulfonate, (p-t-butoxyphenyl)diphenylsulfonium trifluoromethanesulfonate, tris(p-t-butoxyphenyl)sulfonium trifluoromethanesulfonate, triphenylsulfonium p-toluenesulfonate and the like.

Particular examples of the nitrobenzyl-based photoacid generator may include 2-nitrobenzyl-p-toluenesulfonate, 2,6-dinitrobenzyl-p-toluenesulfonate, 2,4-dinitrobenzyl-p-toluenesulfonate and the like. Particular examples of the sulfonic acid ester-based photoacid generator may include 1,2,3-tris(methanesulfonyloxy)benzene, 1,2,3-tris(trifluoromethanesulfonyloxy)benzene, 1,2,3-tris(p-toluenesulfonyloxy)benzene and the like. Particular examples of the diazomethane-based photoacid generator may include bis(benzenesulfonyl)diazomethane, bis(p-toluenesulfonyl)diazomethane and the like. Specific examples of the glyoxime-based photoacid generator may include bis-O-(p-toluenesulfonyl)-α-dimethylglyoxime, bis-O-(n-butanesulfonyl)-α-dimethylglyoxime and the like. Particular examples of the N-hydroxyimide sulfonic acid ester-based photoacid generator may include N-hydroxysuccinimide methanesulfonic acid ester, N-hydroxysuccinimide trifluoromethanesulfonic acid ester and the like. Particular examples of the halotriazine-based photoacid generator may include 2-(4-methoxyphenyl)-4,6-bis(trichloromethyl)-1,3,5-triazine, 2-(4-methoxynaphthyl)-4,6-bis(trichloromethyl)-1,3,5-triazine and the like.

The photoacid generator may be included at an amount of 0.01 to 15 wt %, based on the total weight of solid content in the anti-reflective coating composition. More specifically, the content of the photoacid generator may be in a range of 3 to 10 wt %.

(c) Crosslinker

The crosslinker used in the present invention is not specifically limited and may be any crosslinking substance that may initiate a crosslinking reaction by light and/or heat, preferably a compound that may initiate a crosslinking reaction by heat.

Said crosslinking substance is cured, crosslinked or hardened when a photoacid generator releases an acid upon exposure to an active radiation rays.

Preferred crosslinkers of the present invention may be, for example, melamine-based crosslinkers, glycoluril-based crosslinkers, benzoguanamine-based crosslinkers, urea-based crosslinkers, etc. One particular example of melamine-based crosslinkers may be melamine-formaldehyde resin.

Said crosslinkers are commercially available, for example, melamine-based crosslinkers such as manufactured by American Cyanamid and sold under the trade name of Cymel 300, 301 and 303; glycouril-based crosslinkers such as manufactured by American Cyanamid and sold under the trade name of Cymel 1170, 1171 and 1172; urea-based crosslinkers such as manufactured by American Cyanamid and sold under the trade name of Beetle 60, 65 and 80; and benzoguanamine-based crosslinkers such as manufactured by American Cyanamid and sold under the trade name of Cymel 1123 and 1125.

The amount of the crosslinker may be 1 to 20 wt %, based on the total weight of the anti-reflective coating composition. More specifically, the amount of the crosslinker may be 5 to 15 wt %.

(d) Thermal Acid Generator

The anti-reflective coating composition for NTD may further comprise a thermal acid generator.

The thermal acid generator promotes or improves the crosslinking reaction during the curing process of the anti-reflective coating composition layer.

Additionally, the thermal acid generator may be ionic or substantially neutral thermal acid generators.

In one embodiment, the thermal acid generator may be arenesulfonic acid-based thermal acid generators, more specifically, benzenesulfonic acid-based thermal acid generators The amount of the thermal acid generator may be 0.1 to 2.0 wt %, based on the total weight of the anti-reflective coating composition. More specifically, the amount of the thermal acid generator may be 0.5 to 1.0 wt %.

(e) Solvent

The anti-reflective coating composition may comprise a solvent.

Particular examples of the solvent may include oxybutyric acid esters such as methyl 2-hydroxyisobutyrate, ethyl lactate and the like; glycol ethers such as 2-methoxyethyl ether, ethylene glycol monomethyl ether, propylene glycol monomethyl ether and the like; ethers having hydroxy moieties such as methoxy butanol, ethoxy butanol, methoxy propanol, ethoxy propanol and the like; esters such as methyl cellosolve acetate, ethyl cellosolve acetate, propylene glycol monomethyl ether acetate, dipropylene glycol monomethyl ether acetate and the like; dibasic esters; propylene carbonates; and gamma-butyrolactones.

In general, the solids content of the anti-reflective coating composition may vary from 0.1 to 2.0 wt %. More specifically, the solids content of the anti-reflective coating composition may vary from 0.7 to 1.0 wt %.

Method for Forming a Pattern by Negative Tone Development (NTD)

A method for forming a pattern by negative tone development of the present invention comprises the steps of: (1) forming on a substrate a layer of an anti-reflective coating composition comprising (a) an organic polymer, (b) a photoacid generator, and (c) a crosslinker; (2) forming a layer of a photoresist composition on the anti-reflective coating composition layer; (3) exposing the photoresist composition layer and the anti-reflective coating composition layer to activating radiation at the same time, followed by baking; and (4) developing the exposed photoresist composition layer with an organic solvent developer.

Step (1): Formation of Anti-Reflective Coating Composition Layer

In this step, a layer of an anti-reflective coating composition is formed on a substrate.

The content of the anti-reflective coating composition according to the present invention is the same as described above, and the anti-reflective coating composition may be prepared by admixing suitable amounts of source materials including an organic polymer, a photoacid generator, a crosslinker, etc.

The anti-reflective coating composition may be applied by any conventional means such as spin coating and the like. The anti-reflective coating composition may be applied on a substrate with a dried layer thickness of between 2.0 nm to 50.0 nm, preferably between 5.0 nm to 30.0 nm.

Preferably, the applied anti-reflective coating composition layer is cured. Cure conditions will vary with the components of the anti-reflective coating composition. Cure conditions may be, for example, from 80° C. to 225° C. for 0.5 to 40 minutes. Cure conditions preferably render the anti-reflective coating composition coating layer substantially insoluble to the photoresist solvent as well as an alkaline aqueous developer solution.

Said anti-reflective coating composition layer may be formed as a single layer or multiple layers. For example, prior to forming the anti-reflective coating composition layer, a second anti-reflective coating composition layer that is different than the anti-reflective coating composition layer is formed on the substrate, and the anti-reflective coating composition layer is formed on the second anti-reflective coating composition layer.

The formation of the anti-reflective coating composition layer can prevent deterioration of the quality of its pattern which is caused by the substrate due to reflecting incident rays when the photoresist composition layer is exposed to radiation, and the formation particularly improves line width (CD) in the pattern and prevents pattern collapse owing to thorough activation of de-blocking of the photoresist composition layer during the exposure process. Additionally, such coatings can also improve depth of focus, exposure latitude and linewidth uniformity.

The substrate may comprise one or more layers.

Said layers contained in the substrate may be one or more conductive layers of aluminum, copper, molybdenum, tantalum, titanium, tungsten or alloys thereof; layers of nitrides or silicides; doped amorphous silicon or doped polysilicon; dielectric layers such as layers of silicon oxide, silicon nitride, silicon oxynitrides or metal oxides; semiconductor layers such as single-crystal silicon; glass layers; quartz layers; and combinations or mixtures thereof.

Also, said layers contained in the substrate may be etched to form a pattern by various techniques, for example, chemical vapor deposition (CVD) such as plasma-enhanced CVD, low-pressure CVD or epitaxial growth; physical vapor deposition (PVD) such as sputtering or evaporation; electroplating and the like.

The substrate may comprise a hard mask layer. Use of a hard mask layer may be desired, for example, with very thin resist layers, where the layers to be etched require a significant etching depth or where the particular etchant has poor resist selectivity. Where a hard mask layer is used, the resist patterns to be formed can be transferred to the hard mask layer and can be used as a mask for etching the underlying layers.

Typical materials for the hard mask include, for example, tungsten, titanium, titanium nitride, titanium oxide, zirconium oxide, aluminum oxide, aluminum oxynitride, hafnium oxide, amorphous carbon, organic polymer, silicon oxynitride, silicon nitride and silicon-organic hybrid materials, but not limited thereto. The hard mask layer may be formed by, for example, CVD, PVD or spin coating technique. The hard mask layer can include a single layer or a plurality of layers of different materials.

Step (2): Formation of Photoresist Composition Layer

A layer of a photoresist composition is formed on the anti-reflective coating composition layer.

The photoresist composition may comprise a matrix polymer, a photoacid generator and a solvent.

The matrix polymer may comprise at least one unit having an acid-cleavable protecting group.

The acid-cleavable protecting group may be, for example, acetal or ester groups that contain a tertiary non-cyclic alkyl carbon (for example, t-butyl) or a tertiary alicyclic carbon (for example, methyladamantyl) covalently linked to a carboxyoxygen of an ester of the matrix polymer.

Suitable units which can be included in the matrix polymer may be, for example, units derived from (alkyl)acrylate, preferably units derived from acid-cleavable (alkyl)acrylate. Particular examples thereof includes units derived from t-butyl acrylate, t-butyl methacrylate, methyladamantyl acrylate, methyl adamantly methacrylate, ethylfenchyl acrylate, ethylfenchyl methacrylate, etc.

Another example of suitable units which can be included in the matrix polymer may be units derived from a non-aromatic cyclic olefin (endocyclic double bond) such as an optionally substituted norbornene. Still another example of suitable units which can be included in the matrix polymer may be units derived from anhydrides, e.g., maleic anhydride, itaconic anhydride, etc.

Also, the matrix polymer may contain units that contain a heteroatom such as oxygen and sulfur, and, for example, a heterocyclic unit may be fused to the main chain of the matrix polymer.

Further, the matrix polymer may be used as a blend of two or more kinds.

The matrix polymer may be commercially available or prepared by those skilled in the art.

The matrix polymer of the photoresist composition is used in an amount sufficient to render an exposed coating layer of the photoresist developable with a suitable solution, for example, 50 to 95 wt % based on the total weight of solid content in the photoresist composition.

The weight average molecular weight (Mw) of the matrix polymer may be less than 100,000, for example, from 5,000 to 100,000, more specifically 5,000 to 15,000.

Also, the photoresist composition may further comprise a photoactive material employed in an amount sufficient to generate a latent image in a coating layer of the composition upon exposure to activating radiation, and particularly comprise a photoacid generator. Suitable photoacid generator may be the same kinds of photoacid generators as explained in the anti-reflective coating composition.

Also, the photoresist composition may comprise a solvent, for example, glycol ether such as 2-methoxyethyl ether, ethylene glycol monomethyl ether and propylene glycol monomethyl ether; propylene glycol monomethyl ether acetate; lactates such as ethyl lactate and methyl lactate; propionate such as methyl propionate, ethyl propionate, ethyl ethoxy propionate and methyl-2-hydroxyisobutyrate; methyl cellosolve acetate; aromatic hydrocarbon such as toluene and xylene; ketone such as acetone, methyl ethyl ketone, cyclohexanone and 2-heptanone. Such solvents may be used alone or in combination of two or more.

The photoresist composition may be applied on to the anti-reflective coating composition layer by spin coating, dipping, roller coating or other conventional coating technique. Preferably, spin coating may be used. For spin coating, the solids content of the coating solution can be adjusted to provide a desired film thickness based upon the specific coating equipment utilized, the viscosity of the solution, the speed of the coating tool and the amount of time allowed for spinning.

A thickness of the photoresist composition layer may be, for example, 50 nm to 300 nm.

Next, the photoresist composition layer may be softbaked to minimize the solvent content in the layer, thereby forming a tack-free coating and improving adhesion of the layer to the substrate. The softbake can be conducted on a hotplate or in an oven. The softbake temperature and time will depend on the particular material of the photoresist and thickness. For example, typical softbakes are conducted at a temperature of from 90° C. to 150° C. for about 30 seconds to 90 seconds.

Additionally, an overcoating layer may be formed on the photoresist composition layer. The overcoating layer is formed for uniform resist pattern, reduction of reflectance during the exposure process of the resist, improved depth of focus and exposure latitude and reduction in defects. The overcoating layer may be formed by spin coating technique using an overcoating composition. The solids content of the coating solution can be adjusted to provide a desired film thickness based upon the specific coating equipment utilized, the viscosity of the solution, the speed of the coating tool and the amount of time allowed for spinning. A thickness of the overcoating layer may be, for example 200 Å to 1,000 Å.

The overcoating layer may be softbaked to minimize the solvent content in the layer. The softbake can be conducted on a hotplate or in an oven. Typical softbakes are conducted at a temperature of from 80° C. to 120° C. for about 30 seconds to 90 seconds.

Step (3): Light Exposure

Next, the photoresist composition layer is exposed to activating radiation through a photomask to create a difference in solubility between exposed and unexposed regions.

The photomask has optically transparent and optically opaque regions.

The exposure wavelength may be, for example, 400 nm or less, 300 nm or less, or 200 nm or less, and preferably 248 nm (for example, KrF excimer laser light) or 193 nm (for example, ArF excimer laser light.

The exposure energy is typically from about 10 to 80 mJ/cm$^2$, dependent upon the exposure device and the components of the photosensitive composition.

After the exposure step of the photoresist composition layer, a post exposure bake (PEB) is conducted.

PEB may be conducted on a hotplate or in an oven. PEB conditions may vary with the components of the photoresist composition layer and thickness. For example, typical PEB is conducted at a temperature of from 80° C. to 150° C. for about 30 seconds to 90 seconds.

Thus, a latent image is produced in the photoresist composition layer due to difference in solubility between light exposed and unexposed regions.

Step (4): Development

The overcoating layer and the exposed photoresist composition layer are then developed to remove unexposed regions, and thus forming a resist pattern.

The developer is typically an organic developer, for example, a solvent selected from ketones, esters, ethers, amides, hydrocarbons and mixtures thereof.

Particular examples of suitable ketone include acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone and methyl isobutyl ketone. Particular examples of suitable ester include methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Particular examples of suitable ether include dioxane, tetrahydrofuran and glycol ether (for example, ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol). Particular examples of suitable amide include N-methyl-2-pyrrolidone, N,N-dimethylacetamide and N,N-dimethylformamide. Particular examples of suitable hydrocarbon include aromatic hydrocarbon solvents (for example, toluene and xylene).

The developer may contain a solvent which can be used in the photoresist composition, for example, 2-heptanone, butyl acetate (for example, n-butyl acetate).

The developer may contain mixtures of these solvents, or one or more of the listed solvents mixed with a solvent other than those described above or mixed with water.

For example, the developer may contain a mixture of a first organic solvent and a second organic solvent. Particular examples of the first organic solvent are $C_{4-9}$ketones; hydroxyalkyl esters such as methyl 2-hydroxyisobutyrate, ethyl lactate; and linear or branched $C_{5-6}$alkoxy alkyl acetate such as propylene glycol monomethyl ether acetate, and preferably 2-heptanone or 5-methyl-2-hexanone. Particular examples of the second organic solvent are linear or branched $C_{6-8}$alkyl esters such as n-butyl acetate, n-pentyl acetate, n-butyl propionate, n-hexyl acetate, n-butyl butyrate and isobutyl butyrate; and linear or branched $C_{8-9}$ketones such as 4-octanone, 2,5-dimethyl-4-hexanone, 2,6-dimethyl-4-heptanone, and preferably n-butyl acetate, n-butyl propionate or 2,6-dimethyl-4-heptanone. Particular examples of combinations of the first and the second organic solvent include 2-heptanone/n-butyl propionate, cyclohexanone/n-butyl propionate, PGMEA/n-butyl propionate, 5-methyl-2-hexanone/n-butyl propionate, 2-heptanone/2,6-dimethyl-4-heptanone, 2-heptanone/n-butyl acetate. Of them, 2-heptanone/n-butyl acetate or 2-heptanone/n-butyl propionate is preferred.

The solvent can be present in the developer in an amount of from 90 to 100 wt %, preferably greater than 95 wt %, greater than 98 wt %, greater than 99 wt % or 100 wt %.

The developer may also include optional additives, for example, surfactants, etc. Such optional additives typically will be present in minor concentrations, for example, about 0.01 to 5 wt %.

The developer can be applied on to the photoresist composition layer by known techniques, for example, spin coating or puddle coating. The development time is for a period effective to remove the unexposed regions of the photoresist. For example, the development is conducted for 5 to 30 seconds at room temperature.

The developed photoresist composition layer may be further cured by performing additional baking at a temperature of 100° C. to 150° C. for several minutes.

The developed substrate may have a substrate region from which a photoresist is removed, and the substrate region may be treated in a selective manner. For example, the substrate region from which the photoresist is removed may be chemically etched or plated using a method well known in the related art. A hydrofluoric acid etching solution, and a plasma gas etching agent such as an oxygen plasma etching agent may be used as an etching agent. For example, the anti-reflective coating composition layer may be removed and the substrate may be etched using the plasma gas etching agent.

Hereinafter, the present invention is described more specifically by the following examples, but these are provided only for illustration purposes, and the present invention is not limited thereto.

Synthesis of Polymer Suitable for 193 nm Anti-Reflective Coating

For the following Preparation Examples and Examples, a reaction equipment consisting of a 100 mL three-necked flask, a round bottom flask equipped with a magnetic stirrer, a temperature regulator box, a temperature probe, an oil bath and a condenser.

Preparation Example: Synthesis of Polymer A-1

13.0 g of tris(2-hydroxyethyl) isocyanurate, 8.6 g of tris(2-carboxyethyl) isocyanurate, 0.24 g of p-toluenesulfonic acid monohydrate, 5.16 g of n-butanol and 14.6 g of anisole were placed in a reaction flask without any particular order. The reaction flask was heated to 140 to 160° C., which was then stirred vigorously for 6 hours to carry out a reaction. Anisole and n-butanol were slowly distilled out of the reaction flask. The resulting reactant was diluted with 67.8 g of methyl 2-hydroxyisobutyrate, and neutralized with triethylamine.

19.2 g of the polymer solution thus obtained was added with 4.09 g of methyl-2-hydroxyisobutyrate and 9.92 g of tetramethoxymethyl glycoluril. The mixture was subjected to a reaction at 50° C. for 3 hours under stirring, cooled down to room temperature, and neutralized with triethylamine.

The resulting reactant was subjected to precipitation by adding with isopropanol/heptane (60/40, v/v) in an amount of 10 times the amount of the reactant. The resulting precipitate was washed with heptane, and filtered through a Buchner funnel to obtain a solid, which was then subjected to air-drying and vacuum drying at 40 to 50° C. overnight to obtain a polymer.

Gel Permeation Chromatography (GPC) was performed using the polymer in THF, and the polymer showed: MW=8,500; and molecular weight distribution=2.9.

Preparation Example: Synthesis of Polymer A-2

27.4 g of t-butylacetyl bis(2-carboxyethyl) isocyanurate, 14.3 g of tris(2-hydroxyethyl) isocyanurate, 8.3 g of 1,2-propanediol and 30 g of anisole were placed in a reaction flask without any particular order. The reaction flask was heated to 150° C., which was then stirred vigorously for 6 hours to carry out a reaction. The solvent and reaction byproducts were slowly distilled out of the flask. The resulting reactant was diluted to 30 wt % solids using tetrahydrofuran.

The resulting reactant was subjected to precipitation by adding isopropanol in an amount of 10 times the amount of the reactant. The resulting precipitate was collected, filtered through a Buchner funnel to obtain a solid, which was then subjected to air-drying and vacuum drying at 40 to 50° C. overnight to obtain a polymer.

Gel Permeation Chromatography (GPC) was performed using the polymer in THF, and the polymer showed: MW=8,700; the molecular weight distribution=1.96; n193=1.94; and k193=0.24.

Preparation of Anti-Reflective Coating Composition

The following components were used to prepare Example and Comparative Examples:

(A-1) and (A-2) polymers: polymers obtained in Preparation Example (B-1) acid catalyst: p-toluenesulfonic acid (PTSA).

(C-1) crosslinker: tetramethoxymethyl glycoluril (TMGU).

(D-1) solvent: methyl 2-hydroxyisobutyrate (HBM).

Comparative Example 1

2.741 g of (A-1) polymer, 0.0260 g of (B-1) acid catalyst, 0.732 g of (C-1) crosslinker and 346.5 g of (D-1) solvent were admixed, stirred for 1 hour, and filtered through a 0.45 µm filter made of polytetrafluoroethylene (PTFE).

Comparative Example 2

2.741 g of (A-2) polymer, 0.0260 g of (B-1) acid catalyst, 0.732 g of (C-1) crosslinker and 346.5 g of (D-1) solvent were admixed, stirred for 1 hour, and filtered through a 0.45 µm filter made of polytetrafluoroethylene (PTFE).

Example 1

2.682 g of (A-2) polymer, 0.0272 g of (B-1) acid catalyst, 0.509 g of (C-1) crosslinker and 339.7 g of (D-1) solvent were admixed, and further added with 0.204 g of triphenylsulfonium triflate (TPS-TF). The mixture was stirred for 1 hour, and filtered through a 0.45 µm filter made of polytetrafluoroethylene (PTFE).

Evaluation of 193 nm NTD Lithography Performance

Each of the anti-reflective coating compositions prepared in Example and Comparative Examples was tested for lithographic performance by negative tone development (NTD).

A silicon substrate was prepared, and an anti-reflective layer (n193=1.69, k193=0.63) for reflectance control was formed on the substrate by using spin coating technique, which was then baked at 205° C. to cure the anti-reflective layer. The anti-reflective coating compositions prepared in Example and Comparative Examples were spin-coated on the substrate coated with the anti-reflective layer to form a layer. In this process, the spin-speed was adjusted so as to minimize the light reflectance at 193 nm which is caused by the substrate during the exposure. The coating layer thus formed was baked at 205° C. to cure the anti-reflective coating layer. A photoresist composition for NTD was coated on the cured coating layer, and subjected to exposure process. For the exposure process, an exposure device S610C (immersion lithography, NA 1.3, X-dipole illumination, sigma: 0.74~0.95, Y-polarization, 41 nm/82 p 6% 180° PSM mask) was employed. Subsequently, the coating layer was developed using n-butyl acetate to obtain a line/space pattern.

Patterns formed were observed under an electronic scanning microscope to measure the line width in the patterns, and the images of the patterns obtained by exposing various amounts of light are shown in FIG. 1. Also, the results of the line CD measured for each sample are summarized in Table 1 below.

TABLE 1

| Anti-reflective coating composition | Line CD |
| --- | --- |
| Comparative Example 1 | 45.47 nm |
| Comparative Example 2 | 43.72 nm |
| Example 1 | 37.33 nm |

As shown in Table 1, the coating layer prepared from the anti-reflective coating composition according to Example 1 showed an improved line CD as compared to the coating layers obtained in Comparative Examples 1 and 2. Therefore, an anti-reflective coating layer used for lithographic process which involves NTD can show improved properties when a photoacid generator, such as used in the composition of Example 1, is employed.

It will be apparent to those skilled in the art that various modifications can be made to the above-described exemplary embodiments of the present invention without departing from the scope of the invention. Thus, it is intended that the present invention cover all such modifications provided they come within the scope of the appended claims and their equivalents.

What is claimed is:
1. A method for forming a pattern by negative tone development, comprising the steps of:
(1) forming on a substrate a layer of an anti-reflective coating composition consisting of (a) an organic polymer, (b) an onium-salt based photoacid generator, and (c) a crosslinker, wherein the organic polymer comprises: (a-1) at least one unit derived from a cyanurate-based compound having two or more groups selected from carboxy and carboxyester; and (a-2) at least one unit derived from a diol or a polyol;

(2) forming a layer of a photoresist composition on the anti-reflective coating composition layer;

(3) exposing the photoresist composition layer and the anti-reflective coating composition layer to activating radiation at the same time, followed by baking; and (4) developing the exposed photoresist composition layer with an organic solvent developer.

2. The method of claim 1, wherein the onium salt is a salt of a sulfonium having an aromatic group and a sulfonate.

3. The method of claim 1, wherein the anti-reflective coating composition comprises from 0.01 to 15 wt % of the photoacid generator based on the total weight of solid content in the composition.

4. The method of claim 1, wherein the crosslinker is a glycoluril-based crosslinker.

5. The method of claim 1, wherein the photoresist composition comprises a matrix polymer, a photoacid generator and a solvent, wherein the matrix polymer comprises at least one unit having an acid-cleavable protecting group.

6. The method of claim 1, wherein prior to forming the anti-reflective coating composition layer, a second anti-reflective coating composition layer that is different than the anti-reflective coating composition layer is formed on the substrate, and the anti-reflective coating composition layer is formed on the second anti-reflective coating composition layer.

7. The method of claim 1 wherein (a-1) may be at least one compound derived from a compound represented by the following Formula 1:

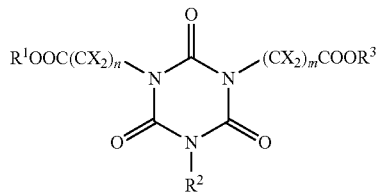

[Formula 1]

wherein at least two of $R^1OOC(CX_2)_n-$, $R^2-$, and $R^3OOC(CX_2)_m-$ represent different acids, or ester groups;

$R^1$, $R^2$, $R^3$ and X each independently represent hydrogen or a non-hydrogen substituent; and n and m are the same as or different from each other, and each is an integer greater than 0.

8. The method of claim 7 wherein $R^1$, $R^2$, $R^3$ and X each independently represent hydrogen a substituted or unsubstituted $C_{1-10}$ alkyl group, a substituted or unsubstituted $C_{2-10}$ alkenyl or $C_{2-10}$ alkynyl group, a substituted or unsubstituted $C_{1-10}$ alkanoyl group, a substituted or unsubstituted $C_{1-10}$ alkoxy group, an epoxy group, a substituted or unsubstituted $C_{1-10}$ alkylthio group, a substituted or unsubstituted $C_{1-10}$ alkylsulfinyl group, a substituted or unsubstituted $C_{1-10}$ alkylsulfonyl group, a substituted or unsubstituted carboxyl group, a substituted or unsubstituted —COO—$C_{1-8}$ alkyl group, a substituted or unsubstituted $C_{6-12}$ aryl group, or a substituted or unsubstituted 5- to 10-membered heteroalicyclic or heteroaryl group; and n and m are the same as or different from each other, and each is an integer greater than 0.

9. The method of claim 1 wherein the anti-reflective coating composition is cured prior to forming the photoresist layer on the anti-reflective coating composition.

10. The method of claim 9 wherein the cured antireflective coating composition is substantially insoluble to an alkaline aqueous developer.

11. A method for forming a pattern by negative tone development, comprising the steps of:

(1) forming on a substrate a layer of an anti-reflective coating composition consisting of:

(a) an organic polymer comprising: (a-1) at least one unit derived from a cyanurate-based compound having two or more groups selected from carboxy and carboxyester; and (a-2) at least one unit derived from a diol or a polyol;

(b) a photoacid generator that is a sulfonium salt comprising an aromatic group and a sulfonate anion in an amount of 0.01 to 15 wt % of the photoacid generator based on the total weight of solid content in the composition, and (c) a glycoluril-based crosslinker;

(2) forming a layer of a photoresist composition on the anti-reflective coating composition layer;

(3) exposing the photoresist composition layer and the anti-reflective coating composition layer to activating radiation at the same time, followed by baking; and (4) developing the exposed photoresist composition layer with an organic solvent developer.

* * * * *